(12) United States Patent
Wu et al.

(10) Patent No.: US 10,488,459 B2
(45) Date of Patent: Nov. 26, 2019

(54) DEVICE FOR PRESSING ELECTRONIC COMPONENT WITH DIFFERENT DOWNWARD FORCES

(71) Applicant: CHROMA ATE INC., Taoyuan (TW)

(72) Inventors: Chi-Chen Wu, Taoyuan (TW);
Meng-Kung Lu, Taoyuan (TW);
Yun-Jui Cheng, Taoyuan (TW);
Chien-Ming Chen, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 63 days.

(21) Appl. No.: 15/841,626

(22) Filed: Dec. 14, 2017

(65) Prior Publication Data
US 2018/0292452 A1 Oct. 11, 2018

(30) Foreign Application Priority Data
Apr. 6, 2017 (TW) .............................. 106111558 A

(51) Int. Cl.
*G01R 31/28* (2006.01)
*G01R 1/04* (2006.01)
(52) U.S. Cl.
CPC ....... *G01R 31/2891* (2013.01); *G01R 1/0433* (2013.01)
(58) Field of Classification Search
CPC . G01R 31/2891; G01R 1/0466; G01R 1/0433

USPC ........................................ 324/750.16; 439/64
See application file for complete search history.

(56) References Cited

U.S. PATENT DOCUMENTS

| 2010/0244866 | A1* | 9/2010 | Lindsey | ............. | G01R 31/2887 |
| | | | | | 324/762.03 |
| 2012/0208381 | A1* | 8/2012 | Garcia | ............... | H01R 13/2421 |
| | | | | | 439/64 |

* cited by examiner

*Primary Examiner* — Farhana A Hoque
(74) *Attorney, Agent, or Firm* — Muncy, Geissler, Olds & Lowe, P.C.

(57) ABSTRACT

A device for pressing an electronic component with different downward forces includes a first downward-pressure generating device, a depressing head, a second downward-pressure generating device and a depressing piston. The first downward-pressure generating device has the depressing head to apply a first downward pressure to the test socket and a portion of the electronic component. The second downward-pressure generating device has the depressing piston to apply a second downward pressure downward to another portion on the electronic component, so that the electronic component can couple electrically with a plurality of probe of the test socket. Thereupon, at least two downward-pressure generating devices are included to provide at least two different downward pressures to the electronic component solely or simultaneously to the electronic component and the testing equipment, such that specific downward-pressure requirements by precision electronic components can be fulfilled.

10 Claims, 8 Drawing Sheets

DEVICE FOR PRESSING ELECTRONIC COMPONENT WITH DIFFERENT DOWNWARD FORCES

This application claims the benefit of Taiwan Patent Application Serial No. 106111558, filed Apr. 6, 2017, the subject matter of which is incorporated herein by reference.

BACKGROUND OF INVENTION

1. Field of the Invention

The invention relates to a device for pressing an electronic component with different downward forces, and more particularly to the pressing device that is applied to depress an electronic component onto a testing fixture so as to form a combination for testing the electronic component.

2. Description of the Prior Art

Referring to FIG. 1, a schematic view showing a contact of a conventional pressing device and a test socket is demonstrated. As illustrated, the conventional pressing device 1 includes a lift arm 11, a pneumatic damping device 12 and a depressing head 13. The lift arm 11 is to perform the lift operation. The pneumatic damping device 12, a pneumatic cylinder for example, is mainly to apply an exerting force or to act as a buffer for the reaction force. The depressing head 13 is to press down an electronic component C to be tested so as to have accompanying contact points thereof to completely contact corresponding test probes (not shown in the figure) built in the test socket S.

Referring now to FIG. 2A through FIG. 2D, four different stages of a typical depressing stroke of the conventional pressing device of FIG. 1 are schematically shown. In FIG. 2A, the conventional pressing device 1 displaces an electronic component C to an appropriate position over the test socket S. Herein, the pneumatic damping device 12 is preset a predetermined push force for overcoming the required forcing to press down the probes inside the test socket S. Then, in FIG. 2B, the lift arm 11 lowers the depressing head 13 so as to have the electronic component C positioned onto the test socket S.

Further, in FIG. 2C, the lift arm 11 keeps to further lower the depressing head 13, such that the pneumatic damping device 12 would be depressed downward, and then an air-accommodating room As inside the pneumatic damping device 12 would be squeezed so as to generate a downward push forcing upon the electronic component C. Thus, sufficient forcing would be finally obtained to overcome the aforesaid required forcing for ensuring fully contact between the contact points of the electronic component C and the probes in the test socket. At this time, in FIG. 2D, a testing upon the electronic component C can be started.

Referring now to FIG. 3, a plot demonstrating a pressure change of the conventional depressing head upon the electronic component is shown. Namely, during the stroke of depressing the electronic component C onto the test socket S as shown in FIG. 2B and FIG. 2C, i.e. upon when the electronic component C is placed on the test socket S and the lift arm 11 is lowered to perform the contact push, then a severe-fluctuated forcing waveform would be abruptly generated to the downward pressure. As shown in FIG. 3, the severe-fluctuated forcing waveform is demonstrated bun the spikes from point B to point D. However, to a fragile chip (a glass-based chip for example), such a fluctuation in the downward pressure would imply a risk to break or fracture the chip.

Refer now to FIG. 4A through FIG. 4C; where FIG. 4A is a plot demonstrating a contact-pressure change of the depressing head while the downward pressure is set to be 1 kgf, FIG. 4B is a plot demonstrating a contact-pressure change of the depressing head while the downward pressure is set to be 3 kgf, and FIG. 4C is a plot demonstrating a contact-pressure change of the depressing head while the downward pressure is set to be 5 kgf. As shown in FIG. 4A, by having a typical test on the conventional equipment for example, in the case that the downward pressure is preset to be 1 kgf, then the highest peak of the fluctuated downward pressure would reach 1.9 kgf, and the fluctuating duration would be about 0.022 seconds. Further, as shown in FIG. 4B, in the case that the downward pressure is preset to be 3 kgf, then the highest peak of the fluctuated downward pressure would reach 7 kgf, and the fluctuating duration would be about 0.031 seconds. In addition, as shown in FIG. 4C, in the case that the downward pressure is preset to be 5 kgf, then the highest peak of the fluctuated downward pressure would reach 8.8 kgf, and the fluctuating duration would be about 0.035 seconds.

As described above, from FIG. 4A to FIG. 4C and also by the aforesaid explanation, the highest peak at the fluctuated downward is pressure would reach almost twice of the preset value. Such an instant high downward pressure would be definitely a difficulty to the high-precision chip. It can be foreseen that a broken chip might be inevitable. Further, it shall be particularly cautious that potential cracks out of visions of naked eyes might exist on this chip. It is quite possible that, after some service hours, these potential cracks might grow to a degree that a normal operation of the chip would be infeasible. Thereupon, efficiency and service life of the chip would be significantly reduced.

SUMMARY OF THE INVENTION

Accordingly, it is the primary object of the present invention to provide a device for pressing an electronic component with different downward forces, which can provide at least two different downward pressures at individual areas or objects, such as different spots on the same electronic component, or the electronic component to be tested and a specific area on the testing equipment.

According to an embodiment, the device for pressing an electronic component with different downward forces is applied to depress the electronic component to make the electronic component electrically contact with a plurality of probes of a test socket. The device includes mainly a first downward-pressure generating device, a depressing head, a second downward-pressure generating device and a depressing piston. The depressing head is connected with the first downward-pressure generating device. The second downward-pressure generating device is located at a lower portion of the depressing head. The depressing piston is connected with the second downward-pressure generating device. The first downward-pressure generating device drives the depressing head downward to exert a first downward pressure on the test socket, the second downward-pressure generating device drives the depressing piston downward to exert a second downward pressure on the electronic component to make the electronic component electrically contact with the probes of the test socket.

According to another embodiment, the device for pressing an electronic component with different downward forces is applied to depress the electronic component to make the electronic component electrically contact with a plurality of probes of a test socket. The electronic component includes a semiconductor-component zone and a circuit-board zone. The device includes mainly a first downward-pressure generating device, a depressing head, a second downward-pressure generating device and a depressing piston. The depressing head is connected with the first downward-pressure generating device. The second downward-pressure generating device is located at a lower portion of the depressing head. The depressing piston is connected with the second downward-pressure generating device. The first downward-pressure generating device has the depressing head to apply a first downward pressure onto the circuit-board zone so as to make the electronic component electrically contact with and the probes of the test socket, and the second downward-pressure generating device has the depressing piston to apply a second downward pressure onto the semiconductor-component zone.

All these objects are achieved by the device for pressing an electronic component with different downward forces described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a device for pressing an electronic component with different downward forces. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

The device for pressing an electronic component with different downward forces in accordance with the present invention would be elucidated through relevant embodiments as follows. However, it shall be noted that, in the following description, similar elements would be assigned with the same number. Further, drawings of the present invention are used for clearly explaining the embodiments only, and thus are neither prepared proportionally nor provided all the details.

Figure 1:
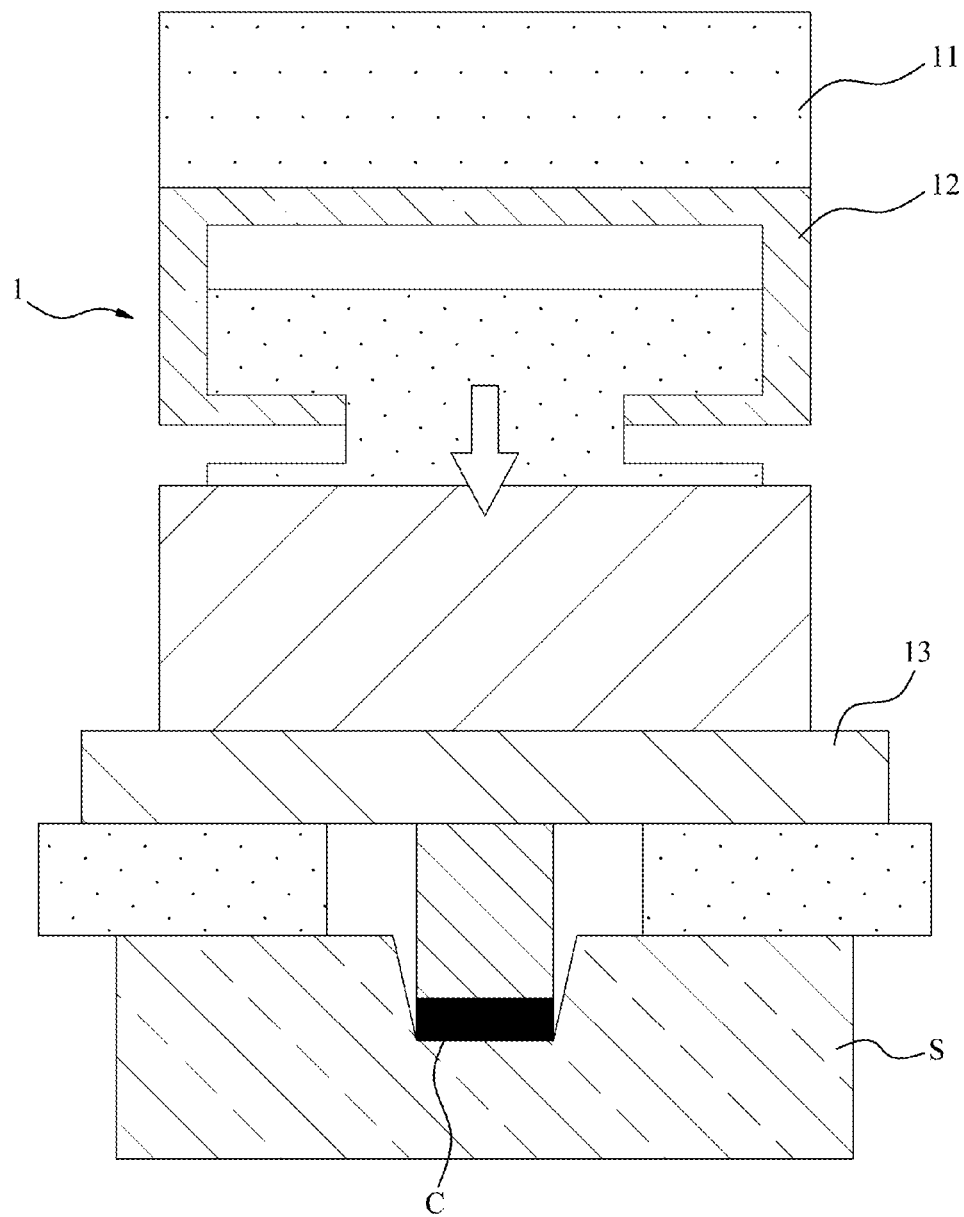
FIG. 1 is a schematic view showing a contact of a conventional pressing device and a test socket.
Figures 2A, 2B, 2C, 2D:
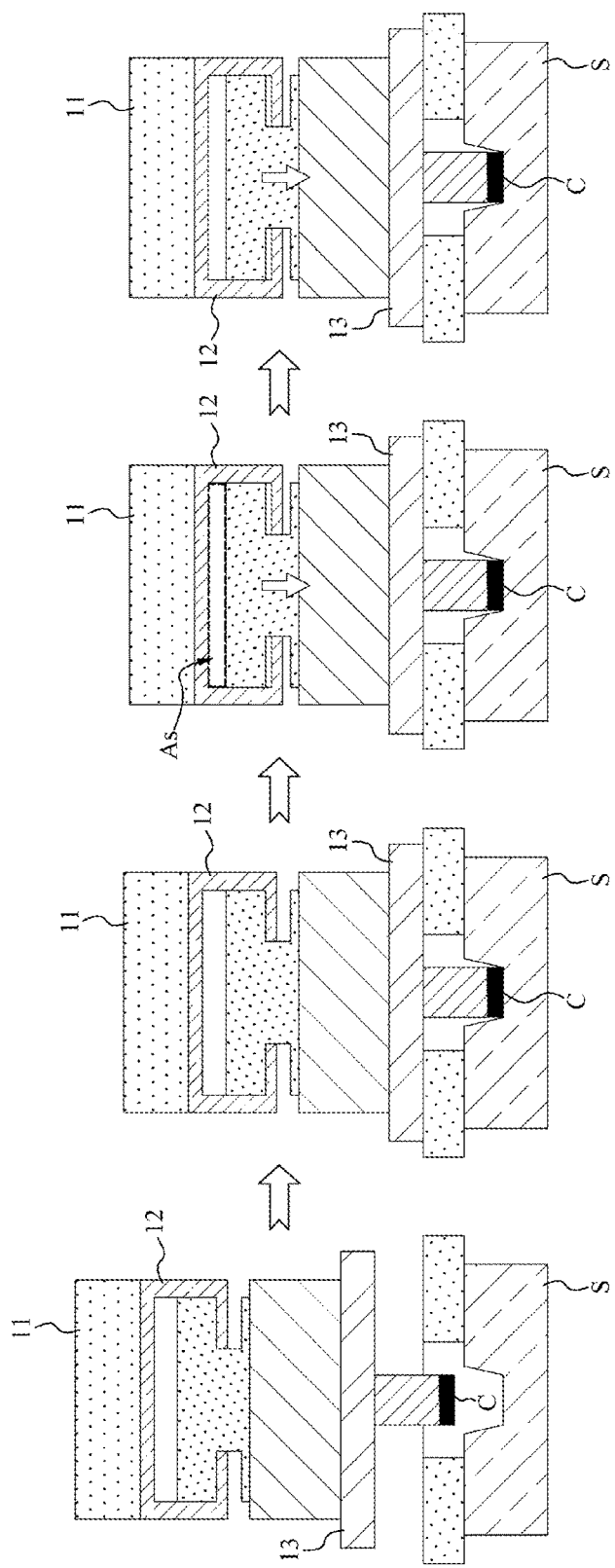
FIG. 2A to FIG. 2D demonstrate schematically different stages of a depressing stroke of the conventional pressing device of FIG. 1.
Figure 3:
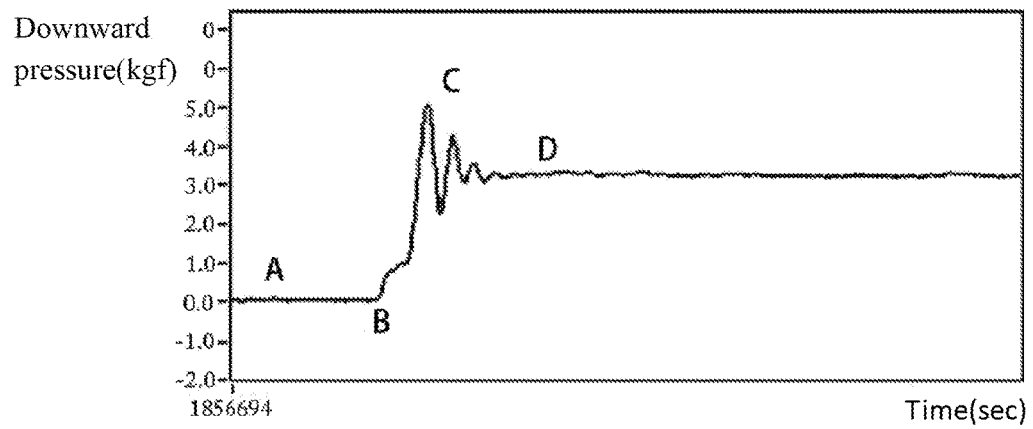
FIG. 3 is a plot demonstrating a pressure change of the conventional depressing head upon the electronic component.
Figure 4A:
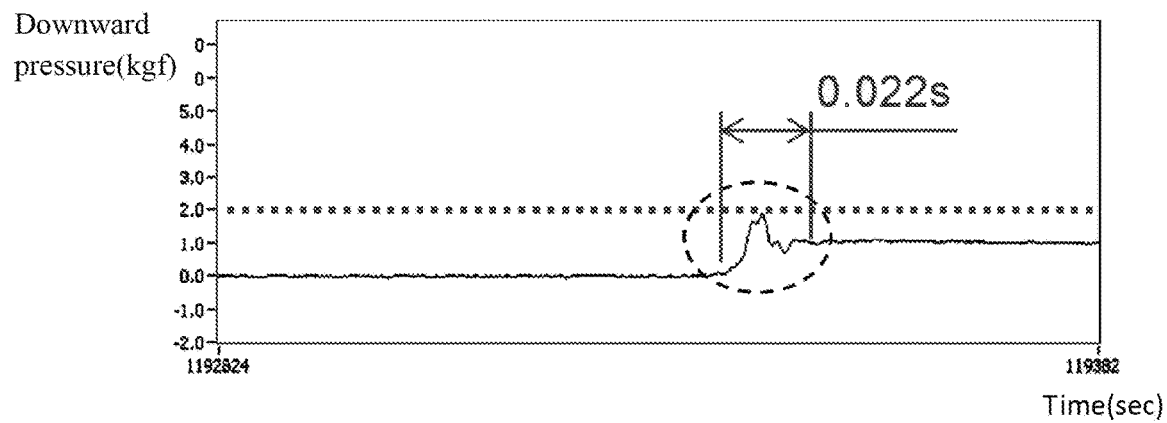
FIG. 4A is a plot demonstrating a contact-pressure change of the depressing head while the downward pressure is set to be 1 kgf.
Figure 4B:
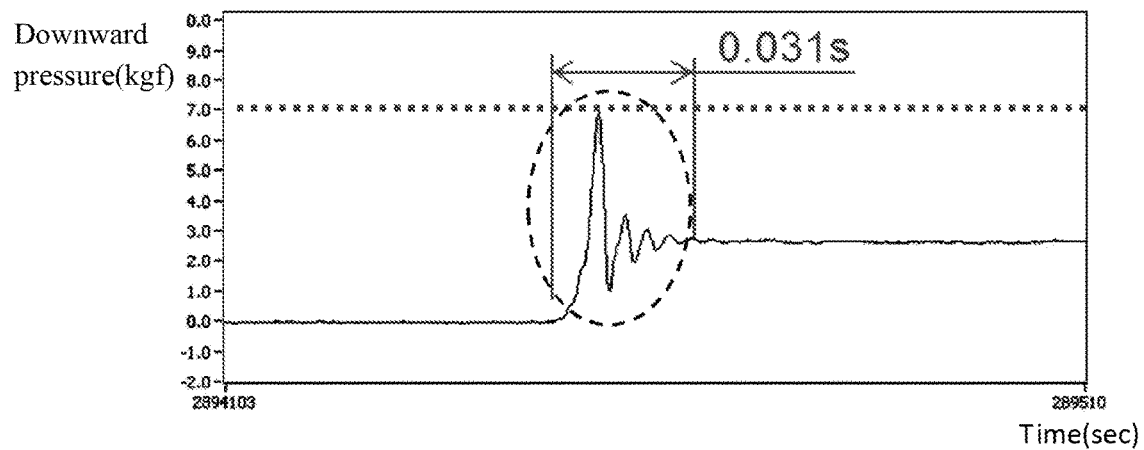
FIG. 4B is a plot demonstrating a contact-pressure change of the depressing head while the downward pressure is set to be 3 kgf.
Figure 4C:
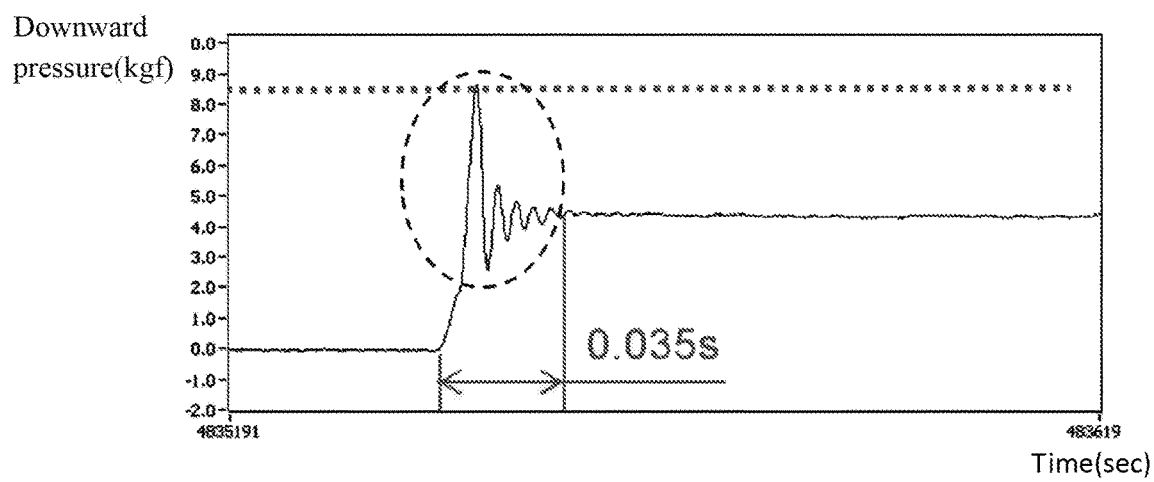
FIG. 4C is a plot demonstrating a contact-pressure change of the depressing head while the downward pressure is set to be 5 kgf.
Figure 5:
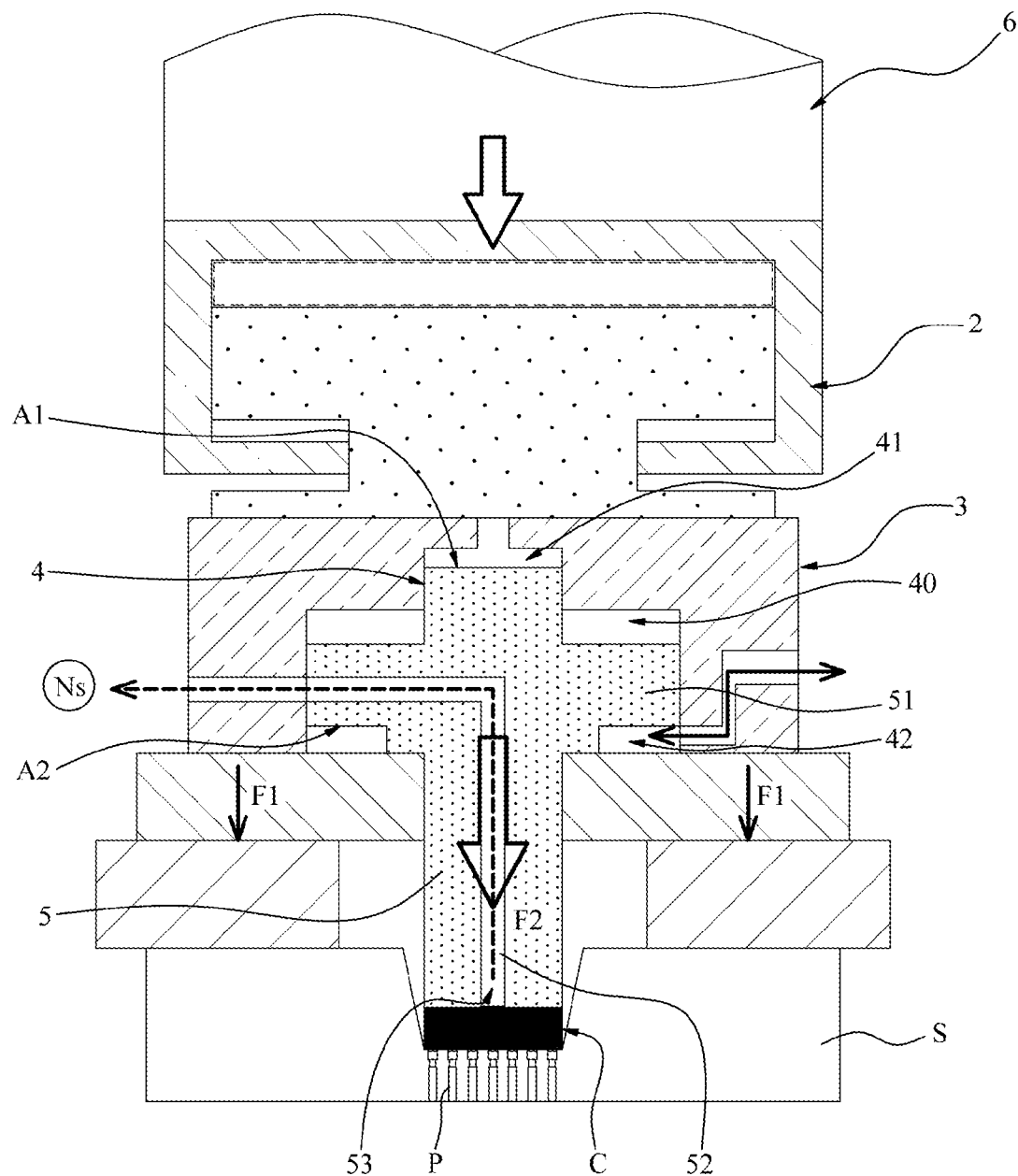
FIG. 5 is a schematic view showing a contact of a first embodiment of the pressing device in accordance with the present invention and a test socket.

Referring now to FIG. 5, a schematic view showing a contact of a first embodiment of the pressing device in accordance with the present invention and a test socket is presented. The pressing device of the present invention is to depress an electronic component C down so as to engage electrically a plurality of probes P of a test socket S. The object to be tested applicable to this invention can be, but not limited to, a raw chip without circuit layouts, a crystal or a semiconductor integrated circuit, packaged or not.

As shown in FIG. 5, the first embodiment mainly includes a lift arm 6, a first downward-pressure generating device 2, a depressing head 3, a second downward-pressure generating device 4 and a depressing piston 5. The lift arm 6 for displacing the electronic components C can move both vertically and horizontally.

Further, the first downward-pressure generating device 2, mounted to a lower end of the lift arm 6, can be a pneumatic or hydraulic damping device that can adjust the downward pressure. In practice, the first downward-pressure generating device 2 can provide steady forcing only if half of a damping compression stroke of the first downward-pressure generating device 2 has been reached. Thereby, in this embodiment, as the lift arm 6 is lowered to depress the first downward-pressure generating device 2 by half of the damping compression stroke, then the downward pressure generated by the first downward-pressure generating device 2 can be denoted as a first downward pressure F1 as shown in FIG. 5.

In addition, the depressing head 3 is connected with the first downward-pressure generating device 2. In this embodiment, the depressing head 3 is to directly contact the test socket S. Namely, a lower surface of the depressing head 3 contacts directly onto an upper surface of the test socket S, such that the first downward-pressure generating device 2 can provide the first downward pressure F1 to depress the test socket S.

Further, the second downward-pressure generating device 4 is located at a lower portion of the depressing head 3. The depressing piston 5 is mounted into the lower portion of the depressing head 3 by coupling the second downward-pressure generating device 4. In this embodiment, the second downward-pressure generating device 4 is formed by pairing an internal chamber 40 and a piston head 51. As shown, the piston head 51 is located in the internal chamber 40 son as thereby to define separately the internal chamber 40 into a first fluid chamber 41 and a second fluid chamber 42, in which the first fluid chamber 41 and the second fluid chamber 42 are located to opposing sides of the piston head 51 in a vertical manner.

Upon such an arrangement, in this embodiment, by injecting a work fluid into the first fluid chamber 41 and/original the second fluid chamber 42 so as to generate a pressure difference between the two fluid chambers 41, 42 for driving the piston head 51 as well as the depressing piston 5 to move vertically, i.e. to apply the downward pressure by moving down or to relieve the downward pressure by moving up. Further, in this embodiment, the first fluid chamber 41 has a first cross-section area A1, and the second fluid chamber 42 has a second cross-section area A2. In particular, the second cross-section area A2 is greater than the first cross-section area A1.

In this embodiment, the work fluid in the first fluid chamber 41 is kept at a specific pressure, and the same work fluid (at the specific pressure) is also fed to the second fluid chamber 42 so as to have an uplift push generated in the second fluid chamber 42, such that the piston head 51 as well as the depressing piston 5 would be pushed upward. On the other hand, if the pressure in the second fluid chamber 42 is relieved by terminating the feeding of the work fluid with the specific pressure, then the internal pressure in the second fluid chamber 42 would drop to be lower than the specific pressure. At this time, the depressing piston 5 would move downward. Further, since an ordinary pressure source in the production line is generally kept at a single fixed pressure for output (the specific pressure in this embodiment for example), and further since the first cross-section area A1 and the second cross-section area A2 in this embodiment are preset to be different, so the respective push forces under the same pressure source would be different.

In the present invention, the aforesaid manipulation upon the internal pressures of the two fluid chambers is mainly based on defining the first fluid chamber 41 as a pressure source by keeping its internal pressure at a specific pressure, and being preset as the downward pressure. According, in each testing, it is no more necessary to wait the fluid pressure in the first fluid chamber 41 to reach the specific pressure, and the lift of the depressing piston 5 can be quickly performed by increasing/decreasing the specific pressure in the second fluid chamber 42. Thereupon, besides the advantage of obtaining a steady source of the specific pressure, the response time for up/down switching would be extremely fast, generally within 0.1 seconds.

On the other hand, in this embodiment, in order to examine precision electronic components C, particularly the glass-based chip, the second downward pressure F2 exerted on the chip shall be cautiously designed. In this embodiment, the second downward pressure F2 is preset to be equal to the product of the first cross-section area A1 and the specific pressure, but larger than or equal to the exerting force of the plurality of the probes P in the test socket S. For the first downward pressure F1 is directly applied to the test socket S, thus the downward pressure can be simply preset to be larger than the second downward pressure F2.

In addition, as shown in FIG. 5, the depressing piston 5 of this embodiment includes a vacuum channel 52 and a chip-sucking hole 53. The vacuum channel 52 extends to penetrate the piston head 51 and the depressing piston 5. The chip-sucking hole 53 is located at the bottom end of the depressing piston 5 for contacting the surface of the electronic component C to be tested. One end of the vacuum channel 52 is connected spatially with the chip-sucking hole 53, while another end of the vacuum channel 52 is connected to a vacuum source Ns. Namely, in this embodiment, the setup of the vacuum channel 52 and the chip-sucking hole 53 is to enable the depressing piston 5 to fetch the electronic component C.

Referring now to FIG. 6A through FIG. 6D, different stages of a depressing stroke of the pressing device of FIGS are schematically shown. In the following descriptions, operations of this embodiment of the pressing device in accordance with the present invention would be elucidated.

Figure 6A:
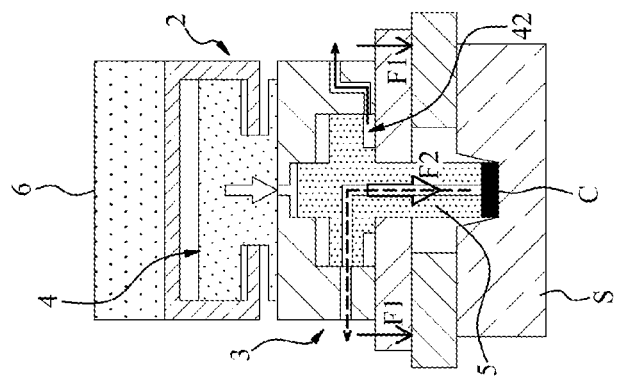
FIG. 6A to FIG. 6D demonstrate schematically different stages of a depressing stroke of the pressing device of FIG. 5.
Figure 6B:
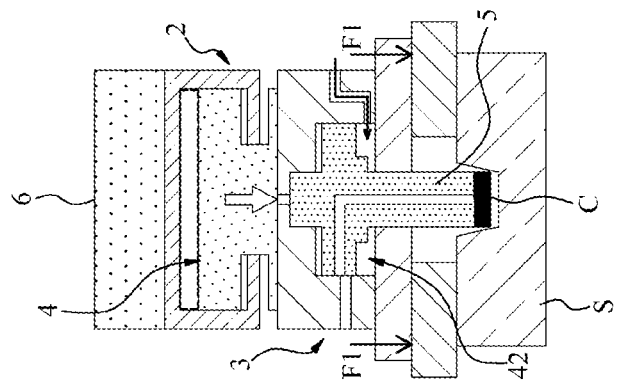
Figure 6C:
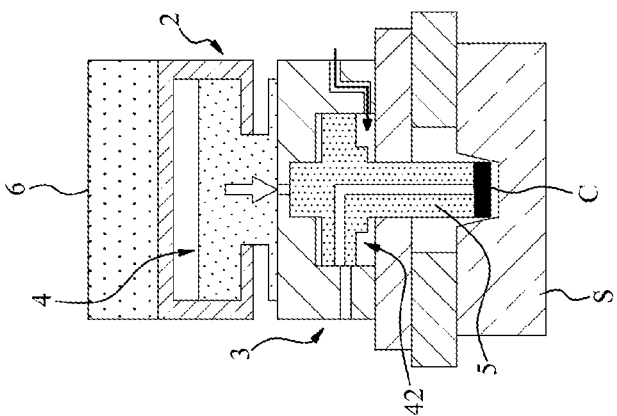

Firstly, the lift arm 6 moves the depressing head 3 to a specific area or a chip container (not shown in the figure) for loading an electronic component C to be tested by sucking, and then displaces the depressing head 3 as well as the electronic component C to a position over the test socket S, as shown in FIG. 6A. Further, the lift arm 6 lowers the depressing head 3 to contact the test socket S, as shown in FIG. 6B. Then, the lift arm 6 keeps lowering the depressing head 3 so as to have the first downward-pressure generating device 2 to be compressed, like a compressed damper, to generate a first downward pressure F1 exerting on the test socket S so as for ensuring a tight contact between the depressing head 3 and the test socket S, as shown in FIG. 6C.

Figure 6D:
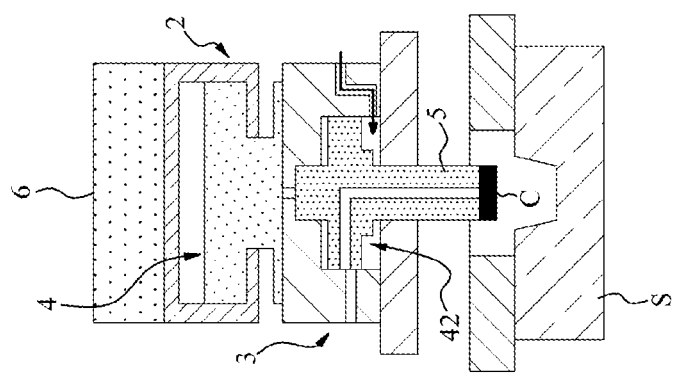

Then, the depressing piston 5 of the depressing head 3 presses down the electronic component C so as to activate the second downward-pressure generating device 4 to exert a second downward pressure F2 on the electronic component C, such that the electronic component C can engage electrically the plurality of probes P in the test socket S. In this stage, by terminating the supply of the specific pressure to the second fluid chamber 42 so as to have the fluid pressure in the second fluid chamber 42 to be lower than the specific pressure, then the depressing piston 5 can down press the electronic component C so as to have the second downward pressure F2 generated by the second downward-pressure generating device 4 to directly exert on the electronic component C, as shown in FIG. 6D.

Thereafter, an examination can be performed upon the electronic component C. After the examination on the test socket S is over, the depressing piston 5 is lifted up to separate the electronic component C and the test socket S. Further, in this stage, by injecting the work fluid (a gas in this embodiment) into the second fluid chamber 42, then the internal pressure of the second fluid chamber 42 would resume to a pressure equal to or higher than the specific pressure. In addition, in this embodiment, since the first cross-section area A1 of the first fluid chamber 41 is preset to be larger than the second cross-section area A2 of the second fluid chamber 42, thus the internal pressure in the second fluid chamber 42 would push the piston head 51 upward so as to drive the depressing piston 5 as well as the electronic component C to move upward and thus to separate the test socket S, as shown in FIG. 6C.

Further, the lift arm 6 moves up the depressing head 3 so as to kill the first downward pressure F1 by separating the depressing head 3 from the test socket S, as shown in FIG. 6A and FIG. 6B. Finally, according to the corresponding testing result, the lift arm 6 would displace the examined electronic component C to a QC-Pass tray or a QC-Fail tray (not shown in the figure).

Figure 7A:
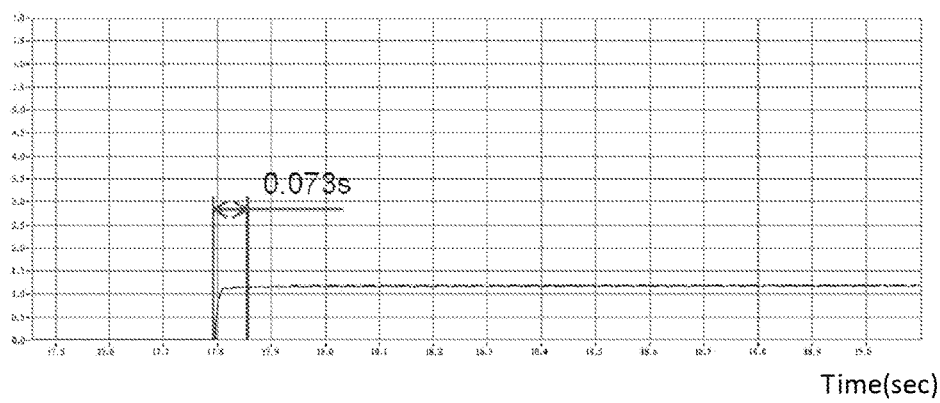
FIG. 7A is a plot demonstrating a contact-pressure change of the pressing device of FIGS while the downward pressure is set to be 1.2 kgf.
Figure 7B:
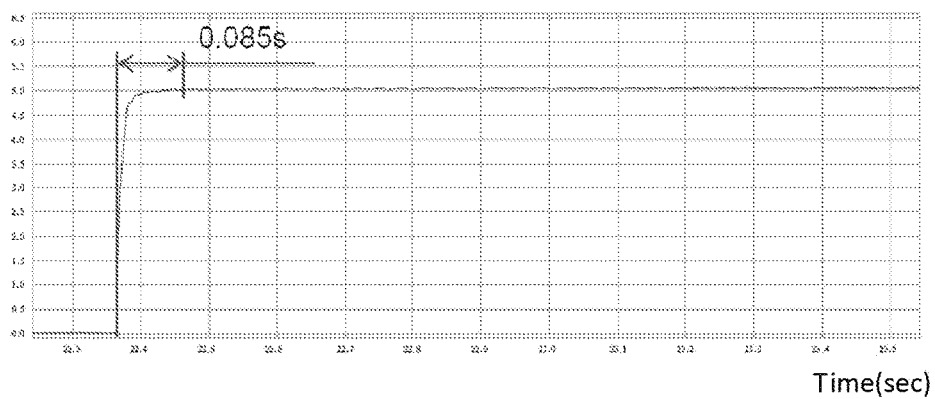
FIG. 7B is a plot demonstrating a contact-pressure change of the pressing device of FIG. 5 while the downward pressure is set to be 5 kgf.

Refer now to FIG. 7A and FIG. 7B; where FIG. 7A is a plot demonstrating a contact-pressure change of the pressing device of FIG. 5 while the downward pressure is set to be 1.2 kgf, and FIG. 7B is a plot demonstrating a contact-pressure change of the pressing device of FIG. 5 while the downward pressure is set to be 5 kgf As show in both figures, no significant spike is found in these waveforms. Namely, in the case that the first embodiment of the pressing device in accordance with the present invention is applied, then no pressure overshot or fluctuation in the downward pressure can be observed. Also, an unstable or transient state of the downward pressure would last less than 0.1 seconds; actually, 0.073 seconds in FIG. 7A and 0.085 seconds in FIG. 7B.

Thus, it is obvious that in this embodiment, two different outputs of the downward pressure (the first downward pressure F1 and the second downward pressure F2) can be provided, in which the first downward pressure F1 is applied to the test socket S so as to ensure a firm contact between the pressing device and the test socket S, while the second downward pressure F2 is applied to the electronic device C to be tested. By providing a rapid and steady output of the second downward pressure F2 according to the aforesaid embodiment of the present invention, the instant severe fluctuated waveform in the downward pressure can be avoided, such that potential crack or breakage on the chip caused by unexpected spikes of the downward pressure can be significantly reduced.

Figure 8A:
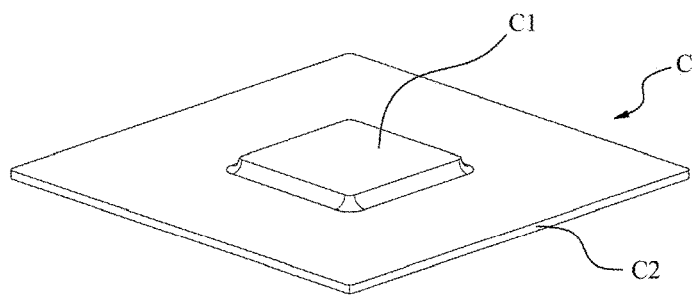
FIG. 8A shows an electronic component applicable to a second embodiment of the pressing device in accordance with the present invention (shown in FIG. 8B)
Figure 8B:
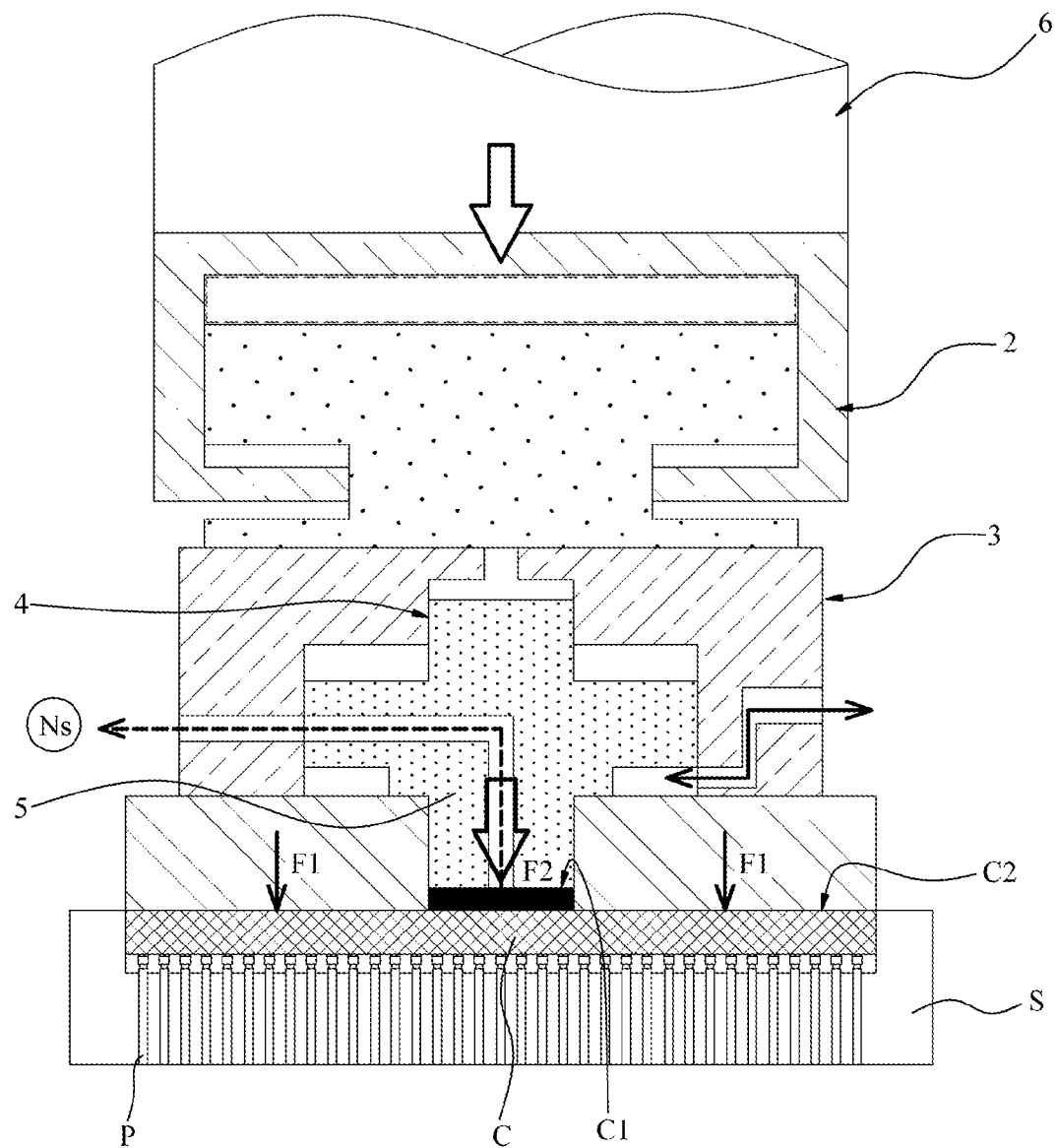
FIG. 8B is a schematic view showing a contact of the second embodiment of the pressing device in accordance with the present invention and a test socket.

Refer now to FIG. 8A and FIG. 8B; where FIG. 8B is a schematic view showing a contact of a second embodiment of the pressing device in accordance with the present invention and a test socket, and FIG. 8A shows an electronic component applicable to the second embodiment of the pressing device of FIG. 8B. The major difference between this second embodiment and the first embodiment is that, in the second embodiment, the object to be tested can be an electronic component C having a printed circuit board or a die, as shown in FIG. 8A. This electronic component C for the second embodiment of the pressing device includes a semiconductor-component zone C1 and a circuit-board zone C2. Definitely, since the integrated circuit on the due is highly precise and extremely fragile, the control upon the downward pressure to the die shall be critical.

However, in this second embodiment, the depressing head 3 is to contact at the circuit-board zone C2 of the electronic component C, while the depressing piston 5 is simply to contact at the semiconductor-component zone Cl of the electronic component C. Namely, the first downward-pressure generating device 2 of this second embodiment is to have the depressing head 3 to exert the first downward pressure F1 on the circuit-board zone C2, so that all electric ports in the circuit-board zone C2 can engage electrically the corresponding probes P in the test socket S. On the other hand, the second downward-pressure generating device 4 for lowering the depressing piston 5 is to exert the second downward pressure F2 on the semiconductor-component zone C1, so that all electric ports on a lower surface of electronic component C can engage electrically the corresponding probes P in the test socket S.

Further, in this embodiment, the first downward pressure F1 is designed to be larger than a sum of the second downward pressure F2 and the exerting forces of the probes in the test socket S, such that it can be ensured that the ports of the electronic component C can be electrically contacted with the corresponding probes P in the test socket S. Thus, two different outputs of the downward pressures (the first downward pressure F1 and the second downward pressure F2) can be applied by this second embodiment of the present invention, in which the first downward pressure F1 is applied to the circuit-board zone C2 of the electronic component C, and the second downward pressure F2 is applied to the semiconductor-component zone C1 of the electronic component C.

It shall be noted that, in the aforesaid two embodiments, the second downward pressure F2 is, but not limited to be, smaller than the first downward pressure F1. In practice, the pairing of the first downward pressure F1 and the second downward pressure F2 can be arranged according to practical requirements. For example, in some situations, the second downward pressure F2 might be arranged to be equal to or larger than the first downward pressure F1. In addition, thought the aforesaid two embodiments provide only two outputs for the downward pressures, yet, to the skills in the art, it shall be understood that more than two outputs in the downward pressures can also be embodied in accordance with the foregoing teachings of the present invention.

While the present invention has been particularly shown and described with reference to a preferred embodiment, it will be understood by those skilled in the art that various changes in form and detail may be without departing from the spirit and scope of the present invention.

What is claimed is:

1. A device for pressing an electronic component with different downward forces, applied to depress the electronic component to make the electronic component electrically contact with a plurality of probes of a test socket, comprising:
    a first downward-pressure generating device;
    a depressing head, connected with the first downward-pressure generating device;
    a second downward-pressure generating device, located at a lower portion of the depressing head; and
    a depressing piston, connected with the second downward-pressure generating device;
    wherein the first downward-pressure generating device drives the depressing head downward to exert a first downward pressure on the test socket, the second downward-pressure generating device drives the depressing piston downward to exert a second downward pressure on the electronic component to make the electronic component electrically contact with the probes of the test socket.

2. The device for pressing an electronic component with different downward forces of claim 1, wherein the second downward-pressure generating device includes a first fluid chamber, a second fluid chamber and a piston head; wherein the first fluid chamber and the second fluid chamber are located respectively to two opposing sides of the piston head, and the depressing piston is connected with the piston head; wherein, by feeding a work fluid into at least one of the first fluid chamber and the second fluid chamber, the piston head and the depressing piston are lifted up/down.

3. The device for pressing an electronic component with different downward forces of claim 2, wherein the first fluid chamber includes a first cross-section area, the second fluid chamber includes a second cross-section area, and the second cross-section area is larger than the first cross-section area.

4. The device for pressing an electronic component with different downward forces of claim 3, wherein an internal fluid pressure of the first fluid chamber is kept at a specific pressure; wherein, by having an internal fluid pressure of the second fluid chamber to be greater than or equal to the specific pressure, the depressing piston is lifted upward; wherein, by having the internal fluid pressure of the second fluid chamber to be smaller than the specific pressure, the depressing piston is lifted downward.

5. The device for pressing an electronic component with different downward forces of claim 4, wherein the first downward pressure is larger than the second downward pressure, the second downward pressure is equal to a product of the first cross-section area and the specific pressure, and the second downward pressure is larger than or equal to exerting forces of the plurality of probes of the test socket.

6. The device for pressing an electronic component with different downward forces of claim 1, wherein the depressing piston includes a vacuum channel and a chip-sucking hole, one end of the vacuum channel being connected spatially with the chip-sucking hole while another end of the vacuum channel is connected spatially with a vacuum source.

7. A device for pressing an electronic component with different downward forces, applied to depress the electronic component to make the electronic component electrically contact with a plurality of probes of a test socket, comprising:
- the electronic component, including a semiconductor-component zone and a circuit-board zone:
- the test socket;
- a first downward-pressure generating device;
- a depressing head, connected with the first downward-pressure generating device;
- a second downward-pressure generating device, located at a lower portion of the depressing head; and
- a depressing piston, connected with the second downward-pressure generating device;
- wherein the first downward-pressure generating device has the depressing head to apply a first downward pressure onto the circuit-board zone so as to make the electronic component electrically contact with the probes of the test socket, and the second downward-pressure generating device has the depressing piston to apply a second downward pressure onto the semiconductor-component zone.

8. The device for pressing an electronic component with different downward forces of claim 7, wherein the second downward-pressure generating device includes a first fluid chamber, a second fluid chamber and a piston head; wherein the first fluid chamber and the second fluid chamber are located respectively to two opposing sides of the piston head, and the depressing piston is connected with the piston head; wherein, by feeding a work fluid into at least one of the first fluid chamber and the second fluid chamber, the piston head and the depressing piston are lifted up/down.

9. The device for pressing an electronic component with different downward forces of claim 7, wherein the first downward pressure is larger than a sum of the second downward pressure and exerting forces of the plurality of probes of the test socket.

10. The device for pressing an electronic component with different downward forces of claim 7, wherein the depressing piston includes a vacuum channel and a chip-sucking hole, one end of the vacuum channel being connected spatially with the chip-sucking hole while another end of the vacuum channel is connected spatially with a vacuum source.

* * * * *